United States Patent [19]

Tam

[11] 4,217,977
[45] Aug. 19, 1980

[54] CONVEYOR SYSTEM

[75] Inventor: Johann Tam, Santa Clara, Calif.

[73] Assignee: The Silicon Valley Group, Inc., Sunnyvale, Calif.

[21] Appl. No.: 942,608

[22] Filed: Sep. 15, 1978

[51] Int. Cl.³ .................... B65G 15/12; B65G 43/08
[52] U.S. Cl. .................... 198/341; 198/344; 198/345; 198/627
[58] Field of Search .............. 198/339, 341, 344, 345, 198/626, 627, 817, 346

[56] References Cited

U.S. PATENT DOCUMENTS

| | | | |
|---|---|---|---|
| 803,667 | 11/1905 | Causey | 198/627X |
| 3,283,882 | 11/1966 | Conrad | 198/817 |
| 3,595,369 | 7/1971 | Boulay et al. | 198/627 X |
| 4,040,512 | 8/1977 | Ness | 198/460 |
| 4,161,138 | 7/1979 | Marchetti | 198/627 X |

*Primary Examiner*—James L. Rowland
*Attorney, Agent, or Firm*—Donald C. Feix

[57] ABSTRACT

A conveyor system for conveying a relatively fragile work piece, such as a silicon wafer, to and from a work station where one or more processing operations are performed on the work piece comprises two parallel conveyor belts. Each conveyor belt is mounted on a separate carriage, and the carriages are moveable laterally toward and away from each other during different periods of operation of the conveyor system and also to enable different size work pieces to be carried by the conveyor belts. The conveyor belts are driven by a drive belt system which comprises a fixed length, closed loop drive belt and a pulley arrangement operatively associated with the drive belt for accommodating lateral motion of the carriages while permitting drive of the conveyor belts at all lateral positions of the carriages and without any change in the length of the drive belt. The conveyor system also provides positive handling of the work piece during all conveying and processing operations to minimize breakage of the work piece. The conveyor system incorporates a vertically moveable spindle and chuck at the work station for lowering the work piece to a processing position below the conveyor belt. Centering and sensing apparatus are located at the work station to center the work piece above the chuck and to coordinate the vertical movement of the chuck with the lateral movement of the carriages and to provide the positive handling of the work piece at each stage of transport and processing of the work piece.

13 Claims, 19 Drawing Figures

CONVEYOR SYSTEM

BACKGROUND OF THE INVENTION

The present invention relates to a conveyor system for conveying work pieces to and from a work station. It has particular application to a conveyor system of a kind used to convey relatively fragile work pieces, such as silicon wafers, to and from a work station where one or more processing operations, such as grinding of the edge contour, rinsing, drying and coating, are performed on the work piece.

Silicon wafers are cut from ingots and require several processing operations, such as grinding of the edge contour, rinsing, drying and coating, before the wafers are used further in the fabrication of electronic circuits.

The wafers are relatively fragile, and relatively high breakage rates have been produced by prior art transport and processing apparatus.

The silicon wafers vary in diameter. For example, the wafers may be 3, 4 or 5 inch diameter. A conveyor system in a silicon wafer processing machine should therefore be able to readily accommodate these varied diameter wafers without requiring downtime of the conveyor system to re-adjust or to reset the component parts of the conveyor system for a change over from wafers of one diameter to wafers of a different diameter.

SUMMARY OF THE INVENTION

It is a primary object of the present invention to construct a conveyor system which provides positive handling of the work pieces at each stage of transport and processing of the work pieces and which substantially reduces the problem of breakage of work pieces as occurred in the prior art.

It is a related object of the present invention to construct a conveyor system having a relatively short conveyor path provided by two conveyor belts driven by a drive belt system which accommodates lateral motion of the conveyor belts toward and away from each other while permitting drive of the conveyor belts at any selected spacing between the belts.

The conveyor system of the present invention includes first and second carriages which are mounted on a frame in parallel with one another and which are moveable laterally toward and away from each other. The carriages are inter-connected so that each carriage always moves an amount equal to and in a direction opposite to the movement of the other carriage. Each carriage has a conveyor belt for conveying work pieces longitudinally along the carriage.

The conveyor belts are driven by a drive belt system which comprises a drive belt and a pulley arrangement operatively associated with the drive belt for accommodating lateral motion of the carriages while permitting drive of the conveyor belts at any lateral spacing between the carriages. The drive belt is a fixed length, closed loop belt which is operatively looped over each of the pulleys in the drive belt system, and the pulley arrangement includes two idler pulleys located at different levels on each carriage to provide a balancing function with respect to the drive belt so that the overall belt length of the drive belt remains the same at all times, regardless of the spacing between the carriages or the direction of lateral movement of the carriages.

At least one of the idler pulleys on one of the carriages is also mounted on a skewed angle so that one of the strands of that pulley will run at a skewed angle to avoid interference with the other strands of the drive belt.

The conveyor system includes a spindle and chuck located at the work station and mounted for vertical movement with respect to the conveyor belts. Centering pins and a sensing element are also located at the work station for engaging the work piece on the conveyor belts to center the work piece above the chuck at the work station and to sense the presence of the work piece at the work station. The vertical movement of the spindle and chuck is coordinated with the lateral movement of the carriages and conveyor belts to provide positive handling of the work piece at each stage in the transport and processing operations and to insure that the work pieces are positively driven to each position rather than requiring the work piece to fall or to slide into any position. The chuck is raised to lift the work piece off the conveyor belts at the work station, the conveyor belts are then moved apart to permit the work piece to be lowered between the conveyor belts to a processing position below the conveyor belts, and at the conclusion of the processing operation, the chuck is again raised above the conveyor belts and then lowered as the conveyor belts are shifted inward beneath the work piece to gently re-position the work piece on the conveyor belts for transport away from the work station.

Conveyor system apparatus and methods which incorporate the structure and techniques and which are effective to function as described above constitute specific objects of this invention.

Other and further objects of the present invention will be apparent from the following description and claims and are illustrated in accompanying drawings which, by way of illustration, show preferred embodiments of the present invention and the principles thereof and what are not considered to be the best modes contemplated for applying these principles. Other embodiments of the invention embodying the same or equivalent principles may be used, and structural changes may be made as desired by those skilled in the art without departing from the present invention and the purview of the appended claims.

DESCRIPTION OF THE PREFERRED EMBODIMENTS

Figure 1:
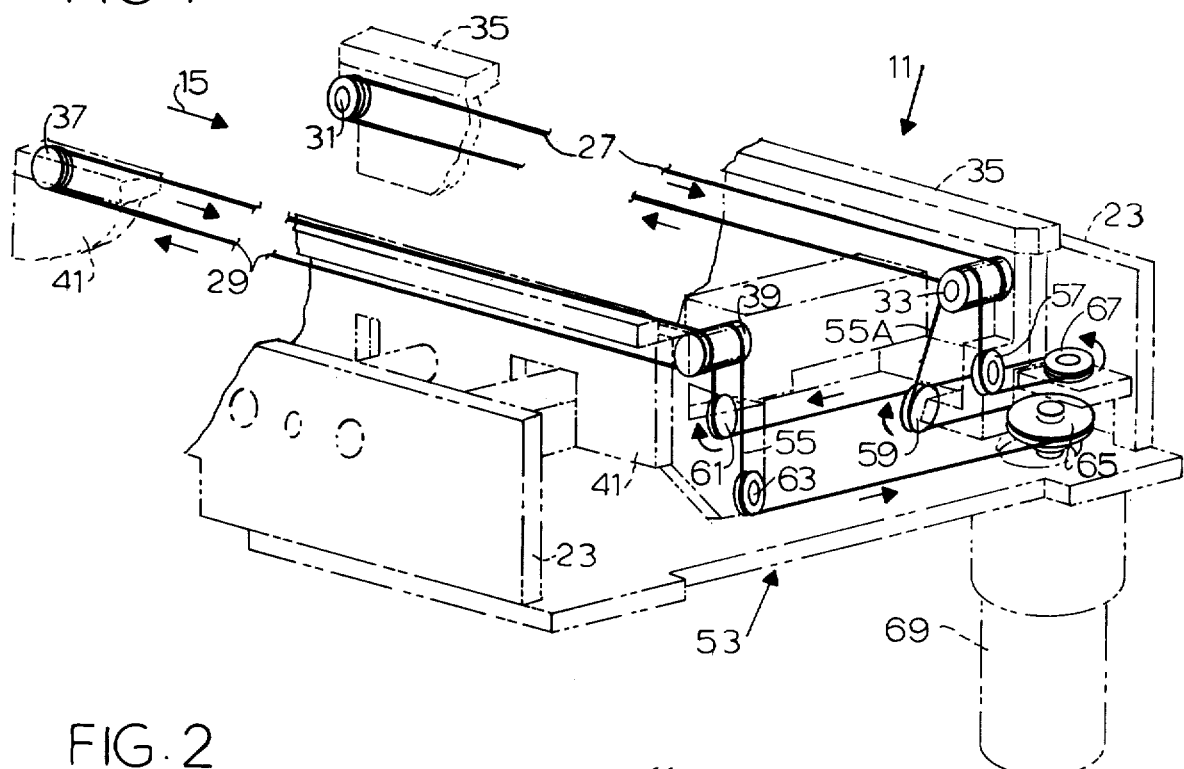
FIG. 1 is an isometric view of a conveyor system constructed in accordance with one embodiment of the present invention. Details of the work station have been omitted from FIG. 1 in order to simplify and to clarify the showing of the drive arrangement for the conveyor belts.
Figure 2:
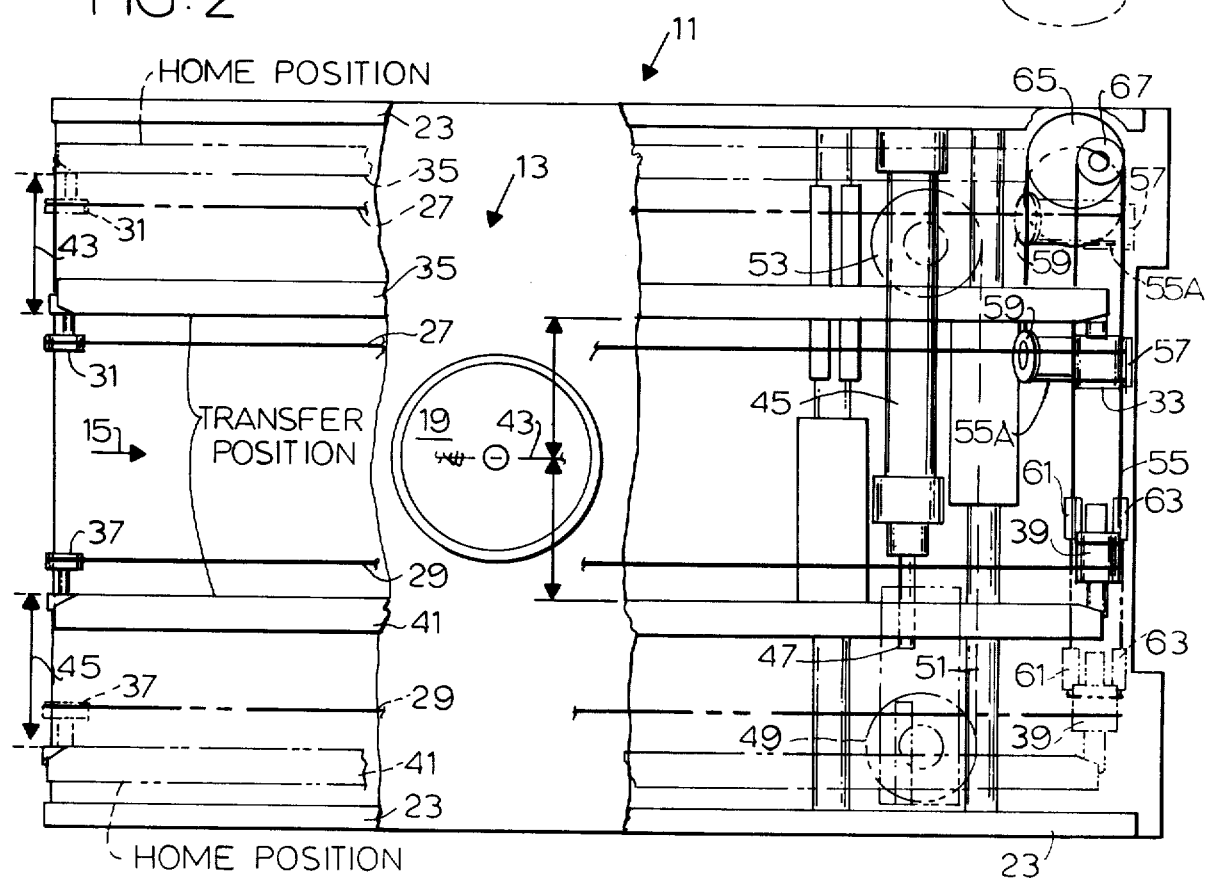
FIG. 2 is a top plan view of the conveyor system shown in FIG. 1.
Figure 3:
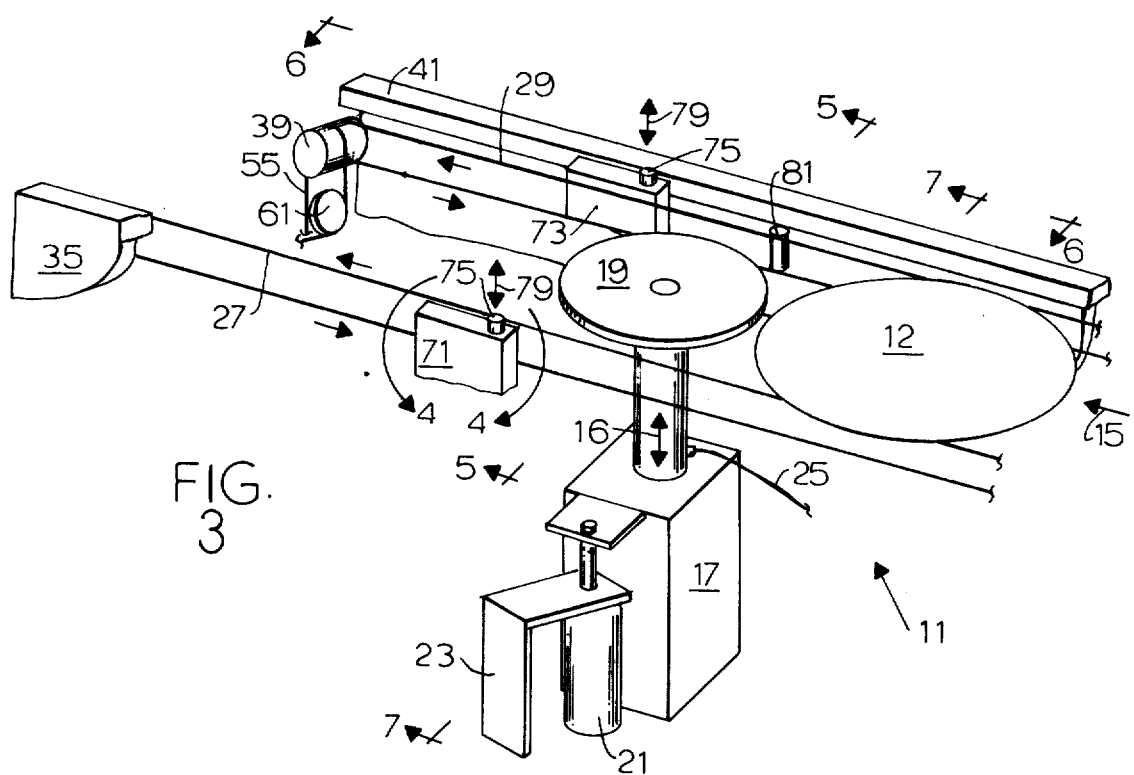
FIG. 3 is a fragmentary, isometric view of the conveyor system shown in FIG. 1 but illustrating details of the chuck and spindle assembly and related centering and sensing structure at the work station. The angle at which the conveyor system is viewed in FIG. 3 is different from that of FIG. 1, so that the direction in which the work piece is transported in FIG. 3 is opposite the direction of transport shown in FIG. 1.

A conveyor system constructed in accordance with one embodiment of the present invention is indicated generally by the reference numeral 11 in FIGS. 1, 2 and 3.

In a specific embodiment of the present invention, the conveyor system 11 is used to convey relatively fragile work pieces 12, such as silicon wafers, to and from a work station 13 (see FIGS. 2 and 3) in the direction indicated by the block arrow 15 in FIGS. 1, 2, 3 and 6.

Figure 7:
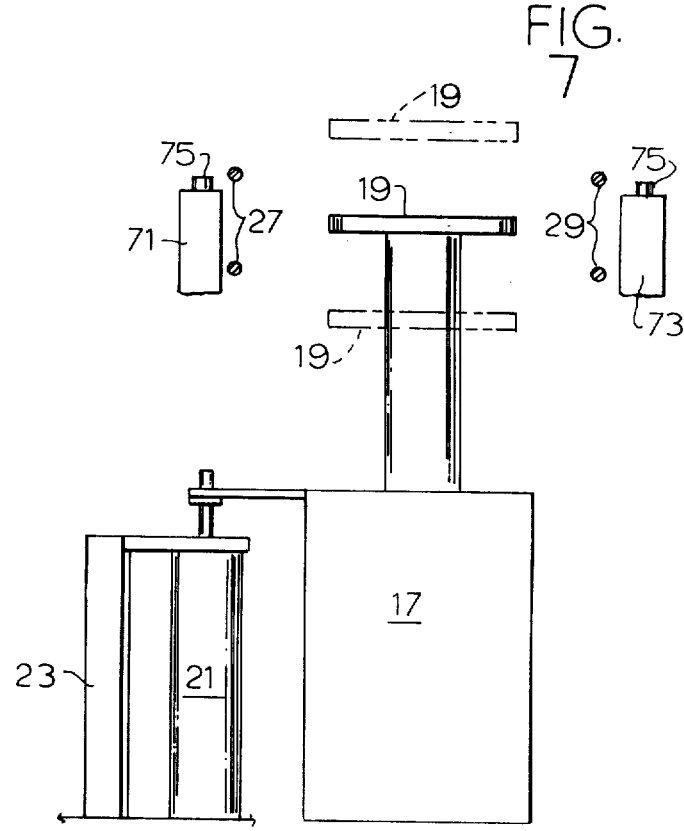
FIG. 7 is an end elevation view showing details of the mounting and movement of the chuck spindle assembly and is taken along the line and in the direction indicated by the arrows 7—7 in FIG. 3.

At the work station 13 a spindle assembly 17 mounts a chuck 19 for rotation. The entire spindle and chuck assembly is moveable up and down (in the direction indicated by the arrows 16 in FIG. 3 and to the various positions shown in FIGS. 5, 6 and 7) by an air motor 21 which is mounted on the main frame 23 of the conveyor system. The vertical movement of the spindle and chuck in coordination with other components of the conveyor system (as will be described in greater detail below) provides a positive handling of the work piece at the work station to minimize breakage or other damage to the work piece.

The chuck 19 is a vacuum chuck which grips the work piece 12 on the underneath side of the work piece, and the vacuum is produced by a vacuum line 25 (see FIG. 3).

Figures 1, 5:
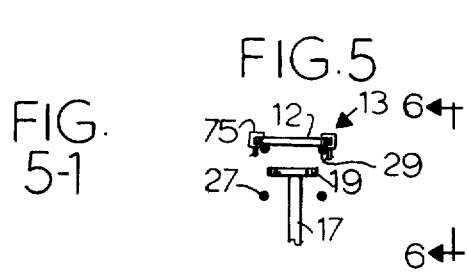
FIG. 5 is a series of sequence views taken along the line and in the direction indicated by the arrows 5—5 in FIG. 3 and shows in end elevation the coordination between the vertical movements of the chuck and spindle assembly and the lateral movements of the carriages for insuring positive handling of each work piece during all transport and processing operations.
Figures 2, 5:
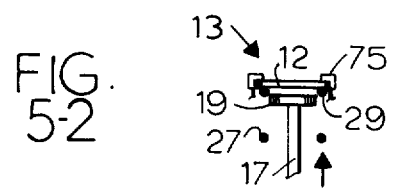
Figures 3, 5:
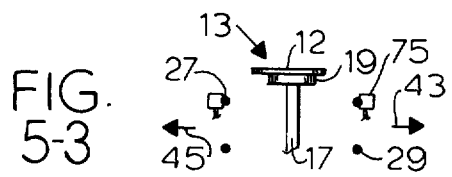
Figures 4, 5:
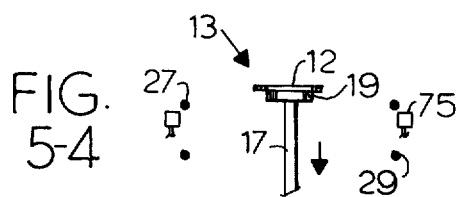
Figure 5:
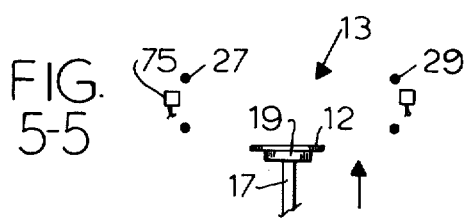
Figures 5, 6:
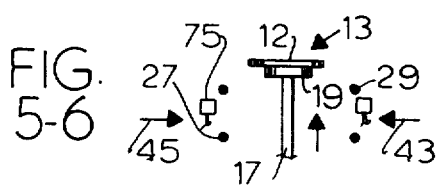
FIG. 6 is a series of side elevation views taken along the line and in the direction indicated by the arrows 6—6 in FIG. 3. The individual FIGS. 6-1 through 6-7 of FIG. 6 correspond to the respective FIGS. 5-1 through 5-7 of FIG. 5.
Figures 5, 6, 7:
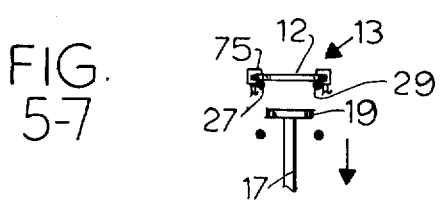
Figures 1, 6:
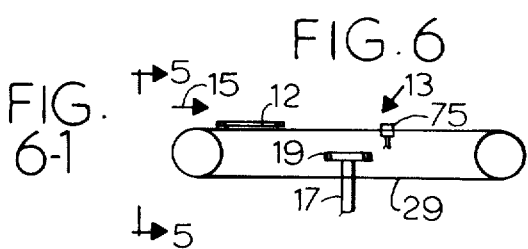
Figures 2, 6:
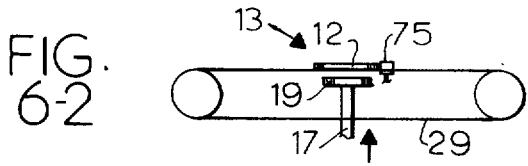
Figures 3, 6:
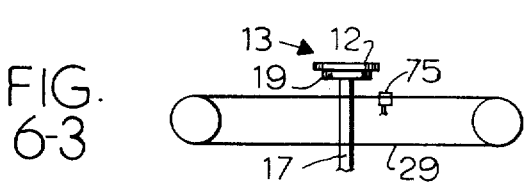
Figures 4, 6:
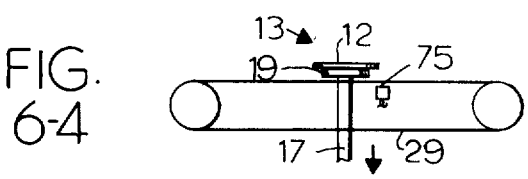
Figures 5, 6:
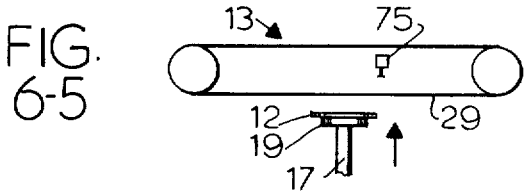
Figure 6:
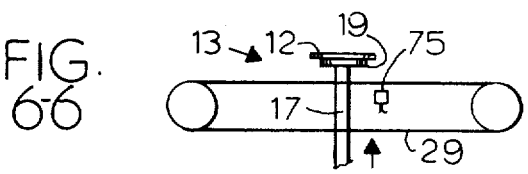
Figures 6, 7:
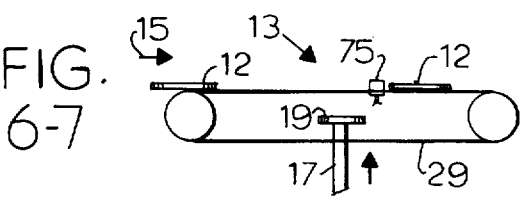

As best illustrated in FIG. 1, the conveyor system 11 incorporates two closed loop, endless conveyor belts 27 and 29 (which are O ring type conveyor belts in a specific embodiment of the present invention) for transporting the work piece to and from the work station 13. As best illustrated in FIGS. 5 and 6, the conveyor belts 27 and 29 engage the work piece 12 along the underside of the work piece and near each side edge to carry the work piece to and from the work station 13.

As best illustrated in FIG. 1, the conveyor belt 27 is mounted on a single strand conveyor pulley 31 and a double strand conveyor pulley 33.

The pulleys 31 and 33 are mounted for rotation on a carriage 35.

The conveyor belt 29 is mounted on a single strand pulley 37 and a double strand conveyor pulley 39.

The pulleys 37 and 39 are mounted for rotation on a carriage 41.

Each of the carriages 35 and 41 is mounted for lateral movement (as indicated by the block arrows 43 and 45 in FIG. 2) on the main frame 23 between an outer, home position (as indicated by the legend in FIG. 2) and an inner, transfer position (as also indicated by the legend in FIG. 2).

The outer, home position is a fixed position, regardless of the size of the work piece; however, the inner, transfer position is dependent upon the width or diameter of the particular work piece being transported by the conveyor system. For smaller diameter work pieces, such as for example 3 inch diameter silicon wafers, the distance between the carriages 35 and 41 at the transfer position is less than is the case when larger diameter work pieces, such as 5 inch diameter silicon wafers, are being transported.

In a specific embodiment of the present invention which utilizes a drive belt and pulley arrangement for driving the conveyor belts 27 and 29 (and which will be described in greater detail below) the carriages 35 and 41 are always equally spaced from the line of centers 43 of the conveyor system 11. Thus, during all lateral movements of the carriages 35 and 41, each carriage is moved in an amount equal to and in a direction opposite to that of the movement of the other carriage.

The lateral shifting of the carriages 35 and 41 is produced by an air motor 45 (see FIG. 2) mounted on the frame 23. A piston rod 47 of the air motor is operatively associated with the carriage 41; and a pulley 49 mounted on the carriage 41, a pulley 53 mounted on the carriage 35, and a cable 51 operatively associated with both the pulley 49 and the pulley 53 provide the equal and opposite lateral movements of the two carriages.

The conveyor system 11 incorporates a drive belt arrangement, indicated generally by the reference numeral 53 in FIGS. 1 and 2, which accomodates the lateral motion of the carriages 35 and 41 while permitting drive of the double conveyor pulleys 33 and 39 at all lateral positions of the carriages on the frame 23. This enables the conveyor system to handle work pieces of different widths, such as, for example, 3 inch, 4 inch and 5 inch diameter silicon wafers, because the conveyor belts 27 and 29 can be shifted inward to the spacing best suited for handling a particular size work piece.

The drive belt arrangement 53 of the present invention further provides the benefits of a belt and pulley drive which is constructed to provide the drive to the conveyor belts 27 and 29 at any lateral spacing between the belts without the need to make any adjustment or re-calibration of the components of the drive belt arrangement itself after a change in the lateral spacing. The drive belt arrangement can in fact provide continuous drive to the conveyor belts while the carriages are being moved laterally in or out.

As best illustrated in FIG. 1, the drive belt arrangement comprises a single, closed loop drive belt 55. In a preferred embodiment of the present invention the drive belt 55 is an O ring drive belt.

The drive belt arrangement 53 also includes the double strand conveyor pulleys 33 and 39, a first set of idler pulleys mounted for rotation on the carriage 35 (and comprising a first upper idler pulley 57 and a first lower idler pulley 59), a second set of idler pulleys mounted for rotation on the carriage 41 (and comprising a second upper idler pulley 61 and a second lower idler pulley 63), a drive pulley 65 mounted for rotation at a fixed location on the frame 23, and a horizontal idler pulley 67 mounted for rotation at a fixed location on the frame 23.

The drive pulley 65 is rotated by a drive motor 69.

In the specific embodiment illustrated in FIG. 1 each of the pulleys 57, 61 and 63 is mounted for rotation on an axis parallel to the direction of movement of the conveyor belts 27 and 29, and the pulley 59 is mounted for rotation on an axis which is skewed with respect to the axes of rotation of the other idler pulleys 57, 61 and 63.

In the particular embodiment illustrated in FIG. 1, the diameter of the drive pulley 65 is also larger than the diameter of the fixed idler pulley 67.

The axes of rotation of the pulleys 65 and 67 are vertical and perpendicular to the axes of rotation of the idler pulleys 57, 61 and 63. The axes of rotation of the pulleys 65 and 67 are also located outwardly of the idler pulleys 57 and 59 in the outer, home position of the carriage 35.

As noted above, the drive belt 55 is a fixed length, closed loop drive belt which is looped over each of the pulleys of the drive belt arrangement, and the pulleys are so arranged that the length of the drive belt 53 does not vary during lateral shifting movement of the carriages 35 and 41.

The drive belt arrangement 53 sends the drive belt 55 out on one level on a carriage (a lower level as illustrated in FIG. 1) and returns the drive belt at a different level (an upper level in the embodiment shown in FIG. 1) on that same carriage and thereby causes the outgoing strand and the returning strand of each carriage to balance each other. The location of the idler pulleys 61 and 63 at different levels on the carriage 41 and the location of the idler pulleys 57 and 59 at different levels on the carriage 35 accomplish this function.

Making the drive pulley 65 of larger diameter than the fixed horizontal pulley 67 and mounting the idler pulley 59 on a skewed axis permits one strand (strand 55A shown in FIG. 1) of the drive belt 57 to run at a skewed angle to avoid interference with the other strands of the drive belt 55.

The conveyor system 11 of the present invention provides positive handling of the work piece at every stage of transport and processing of the work piece. This is particularly important in the handling of relatively fragile work pieces such as silicon wafers. At no place does the conveyor system 11 of the present invention depend upon the wafer to fall. Instead, every position that the wafer gets into is a position to which the wafer has been positively driven. FIGS. 3 through 7 of the drawings illustrate the structure and mode of operation of this part of the conveyor system 11.

Figure 4:
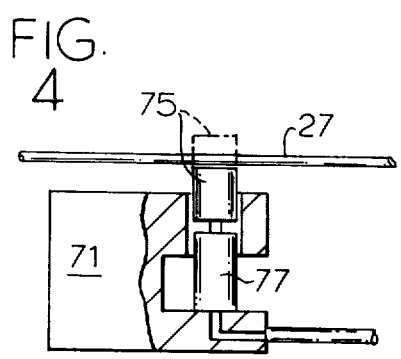
FIG. 4 is a fragmentary enlarged view of the part of the structure of FIG. 3 shown encircled by the arrows 4—4 in FIG. 3.

As illustrated in FIGS. 3, 4 and 6, centering devices 71 and 73 are located at the work station, and each of the centering devices has a pin or cap 75 which is vertically moveable (by an air motor 77) between the lower position shown in solid outline in FIG. 4 and the upper position shown in dashed outline in FIG. 4 (in the direction indicated by the arrows 79 in FIG. 3).

A work piece sensor 81 is also located at the work station 13 for sensing the presence of a work piece at the work station.

The conveyor system 11 includes control logic (not illustrated) for coordinating the vertical movement of the chuck and spindle with the lateral movement of the carriages 35 and 41 to provide this positive handling.

In the operation of the conveyor system, upon the receipt of a start command, the carriages are shifted to the transfer position, the drive motor 69 is turned on and the centering devices 71 and 73 move the caps 75 upward to the positions illustrated in the FIGS. 5-1, 5-2, 6-1 and 6-2.

The work piece 12 travels on the conveyor belts 27 and 29 until the work piece engages the caps 75.

The work piece sensor 81 then senses the presence of the work piece above the work station and signals the control logic to turn off the drive motor 69 and to actuate the motor 21 to raise the spindle assembly 17 and chuck 19 with the vacuum turned on in the line 25.

As illustrated in FIGS. 5-3 and 6-3, the chuck 19 engages the underside of the work piece 12 to lift the work piece 12 up and off the conveyor belts 27 and 29.

The carriages 35 and 41 are then sent out to the home position. In this position the conveyor belts 27 and 29 are moved far enough apart to permit the work piece 12 to be lowered to the process position illustrated in FIGS. 5-5 and 6-5.

The chuck 19 is then driven by the spindle assembly to rotate the work piece 12 during one or more processing operations, such as grinding of the edge contour, rinsing, drying and coating processing operations; and at the end of the processing operations, the spindle assembly 17 and chuck 19 are moved upward as illustrated in FIGS. 5-6 and 6-6.

The carriages 35 and 41 are then moved inward to the transfer position. The chuck 19 is then lowered to the mid position illustrated in FIGS. 5-7 and 6-7 to return the work piece to support by the conveyor belts 27 and 29. During this lowering movement of the chuck 19 the vacuum is turned off in the line 25.

The caps 75 are also lowered to the positions illustrated in FIGS. 5-6 and 6-6 to permit the work piece 12 to be carried away from the work station 13, and the logic turns on the drive motor 69 to take the work piece 12 away from the work station and into a receiving, indexer cassette.

After a time delay, the centering caps 75 return to the up position to center the next work piece being conveyed to the work station 13.

While I have illustrated and described the preferred embodiments of my invention, it is to be understood that these are capable of variation and modification, and I therefore do not wish to be limited to the precise details set forth, but desire to avail myself to such changes and alterations as fall within the purview of the following claims.

I claim:

1. A conveyor system of the kind in which the lateral spacing between two conveyor belts is varied during different periods of operation of the conveyor system, said conveyor system comprising, a frame, first and second carriages mounted on said frame in parallel with each other and moveable laterally toward and away from each other, carriage shift means for selectively moving each carriage laterally in an amount equal to and in a direction opposite to the movement of the other carriage, a conveyor belt on each carriage having an upper surface engagable with the underside of the objects for both supporting and carrying the objects longitudinally along the carriage, a conveyor belt drive pulley mounted for rotation on each carriage about a horizontal axis and engaged with the conveyor belt to drive the conveyor belt, first and second idler pulleys mounted for rotation on each carriage about horizontal axes orthogonal to said horizontal of axis of rotation of the conveyor belt drive pulley, a drive pulley and an idler pulley mounted for rotation on the frame, and drive belt means including a flexible, closed loop, fixed length drive belt operatively looped over each of the pulleys for driving both conveyor belts at all lateral positions the carriages on the frame without change in the length of the drive belt.

2. The invention defined in claim 1 wherein the axes of the drive pulley and the idler pulley mounted for rotation on the frame are vertical axes.

3. The invention defined in claim 1 wherein the first and second idler pulleys on each carriage are positioned to send the drive belt out on one level and to return the drive belt on a different level with respect to that carriage.

4. The invention defined in claim 1 wherein at least one of the idler pulleys on at least one of the carriages is mounted for rotation at a skewed angle with respect to the axes of rotation of the other idler pulleys on the carriages.

5. The invention defined in claim 1 wherein the drive pulley has a larger diameter than the diameter of the idler pulley on the frame.

6. The invention defined in claim 1 including spindle means mounted for vertical movement at a work station midway between the carriages, said spindle means including a chuck for gripping a work piece carried on the conveyor belts from the underneath side of the work piece, and motor means for selectively moving the spindle means and chuck between a high position in which the chuck lifts one of the objects above the conveyor belts and a low position in which the chuck lowers the lifted object below the conveyor belts.

7. The invention defined in claim 6 including control means for coordinating the vertical movement of the chuck with the lateral shifting of the carriages.

8. A conveyor system of the kind in which the lateral spacing between two conveyor belts is varied during different periods of operation of the conveyor system, said conveyor system comprising, a frame, first and second carriages mounted on said frame in parallel with each other and moveable laterally toward and away from each other, carriage shift means for selectively moving each carriage laterally in an amount equal to and in a direction opposite to the movement of the other carriage, conveyor belt means including a conveyor belt on each of the carriages for conveying objects longitudinally along the carriages, and drive belt means including a drive belt having a fixed length and operatively connected to both conveyor belt means for driving both conveyor belts at all lateral positions of the carriages on the frame without change in the length of the drive belt, spindle means mounted for vertical movement at a work station midway between the carriages, said spindle means including a chuck for gripping a work piece carried on the conveyor belts from the underneath side of the work piece, motor means for selectively moving the spindle means and chuck between a high position in which the chuck is above the conveyor belts and a low position in which the chuck is below the conveyor belts, control means for coordinating the vertical movement of the chuck with the lateral shifting of the carriages, and wherein the control means are operatively associated with the other components of the conveyor system to perform the following sequence: convey the work piece to the work station; lift the work piece from the conveyor belts; spread the carriages apart sufficiently far to permit the chuck and work piece to be lowered a processing position below the conveyor belts; lower the work piece to the processing position; rotate the work piece during a processing operation; raise the work piece above the conveyor belts after the conclusion of all processing operations; shift the carriages inward; lower the chuck and work piece until the work piece is again deposited on the conveyor belts; and drive the conveyor belts to transport the work piece from the work station, whereby all of the conveying and processing operations on the work piece are accomplished by positive handling to minimize breakage of the work piece.

9. A drive belt system for driving conveyor pulleys mounted on related ends of first and second carriages which are arranged for selective mutual, opposite, lateral motion with respect to each other, said drive belt system comprising, a drive belt, and pulley means operatively associated with the drive belt for accommodating lateral motion of the carriages while permitting drive of the conveyor pullets at all lateral positions of the carriages without requiring adjustment or recalibration of the drive belt or system components with lateral motion of the carriages, said pulley means including, conveyor belt drive pulleys mounted for rotation on the carriages, first and second idler pulleys mounted for rotation on the carriage about horizontal axes orthogonal to the axes of rotation of the conveyor belt drive pulleys, a drive pulley and an idler pulley mounted for rotation about axes which are fixed in position and which do not change postion as the carriages are moved laterally, and wherein the drive belt is a single, closed loop, fixed length, O ring drive belt operatively looped over each of the pulleys in the drive belt system.

10. A conveyor system for conveying a relatively fragile work piece, such as a silicon wafer, to and from a work station where one or more processing operations are performed on the work piece and for providing positive handling of the work piece during all of the conveying and processing operations to minimize breakage of the work piece, said conveyor system comprising, a frame, first and second carriages mounted on said frame in parallel with each other and moveable laterally toward and away from each other, carriage shift means for selectively moving the carriages laterally toward and away from each other, conveyor belt means including a conveyor belt on each of the carriages for conveying the work piece longitudinally along the carriages, drive means for driving the conveyor belt means, chuck means for holding the work piece on top of the chuck at the work station, spindle means for rotating the chuck and the work piece during a processing operation at the work station, motor means for raising and lowering the chuck and spindle at the work station, and control means operatively associated with the other components of the conveyor system for performing the following sequence:

convey a work piece on the conveyor belts to the work station with the carriages at an inward position in which the conveyor belts are disposed beneath the work piece;

raise the chuck and spindle means to engage the chuck means with the work piece at the work station and to lift the work piece from the conveyor belts;

move the carriages to the outward position where the conveyor belts are spread sufficiently far apart to permit the work piece to be lowered between the conveyor belts to a process position of the chuck and spindle means;

lower the chuck and spindle means and the work piece to the process position;

rotate the chuck and work piece while performing a process operation on the work piece at the process position;

move the chuck and spindle means and the work piece upward to raise the work piece above the conveyor belts;

move the carriages to the inward position where the conveyor belts are disposed beneath the work piece;

lower the chuck and spindle means to deposit the work piece back on the conveyor belts while disengaging the work piece from the chuck means;

drive the conveyor belts to transport the work piece from the work station.

11. A method of conveying a relatively fragile work piece, such as a silicon wafer, to a work station and performing a processing operation on the work piece at the work station and then conveying the work piece away from the work station while providing positive handling of the work piece during all of the conveying and processing operations to minimize breakage of the work piece, said method comprising, conveying a work piece on spaced parallel belts to the work station, raising a chuck between the belts and into engagement with the work piece, lifting the work piece off the belts by continued raising of the chuck, moving the belts sufficiently far apart to permit the work piece to be lowered between the belts to a process position below the belts, lowering the chuck and work piece to the process position, rotating the chuck and work piece while performing a process operation on the work piece at the process position, raising the chuck and work piece above the conveyor belt, moving the conveyor belts to an inward position where the conveyor belts are disposed beneath the work piece, lowering the chuck to deposit the work piece back on the conveyor belts while disengaging the chuck from the work piece, and driving the conveyor belts to transport the work piece from the work space.

12. The invention defined in claim 11 including extending centering devices upward from the work station and to a level above that of the conveyor belts to limit the advance of the work piece on the belts to a position centered over the chuck at the work station.

13. The invention defined in claim 12 including sensing the presence of a work piece over the chuck and raising the chuck to engage the work piece in response to said sensing.

* * * * *